(12) United States Patent
Nishikawa

(10) Patent No.: US 7,615,259 B2
(45) Date of Patent: Nov. 10, 2009

(54) METHOD AND APPARATUS FOR PROCESSING WORKPIECE

(75) Inventor: Hiroshi Nishikawa, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 390 days.

(21) Appl. No.: 10/641,056

(22) Filed: Aug. 15, 2003

(65) Prior Publication Data

US 2004/0099635 A1 May 27, 2004

Related U.S. Application Data

(63) Continuation of application No. PCT/JP02/01279, filed on Feb. 15, 2002.

(30) Foreign Application Priority Data

Feb. 15, 2001 (JP) ............................. 2001-38610

(51) Int. Cl.
*C23C 16/509* (2006.01)
*C23C 16/56* (2006.01)
*H05H 1/46* (2006.01)
*B08B 5/00* (2006.01)
*B08B 9/08* (2006.01)

(52) U.S. Cl. .................. 427/535; 427/534; 427/569; 216/71; 134/19; 134/21; 134/37

(58) Field of Classification Search ............... None
See application file for complete search history.

(56) References Cited

U.S. PATENT DOCUMENTS

| | | | | |
|---|---|---|---|---|
| 4,960,488 A | * | 10/1990 | Law et al. ............... | 438/694 |
| 5,491,603 A | | 2/1996 | Birang et al. | |
| 5,520,742 A | * | 5/1996 | Ohkase ..................... | 118/724 |
| 5,534,072 A | * | 7/1996 | Mizuno et al. ............ | 118/728 |
| 5,622,593 A | * | 4/1997 | Arasawa et al. .......... | 156/345.27 |
| 5,849,092 A | * | 12/1998 | Xi et al. ................... | 134/1.1 |
| 5,856,240 A | * | 1/1999 | Sinha et al. ............... | 438/758 |
| RE36,810 E | * | 8/2000 | Arasawa et al. .......... | 156/345 |
| 6,125,025 A | | 9/2000 | Howald et al. | |
| 6,323,133 B1 | * | 11/2001 | Donohoe et al. .......... | 438/710 |

(Continued)

FOREIGN PATENT DOCUMENTS

JP 07-074231 3/1995

(Continued)

OTHER PUBLICATIONS

Translation JP 09-232290 to H. Nishisaka, publication date Sep. 5, 1997.*

(Continued)

*Primary Examiner*—Marianne L Padgett
(74) *Attorney, Agent, or Firm*—Oblon, Spivak, McClelland, Maier & Neustadt, L.L.P.

(57) ABSTRACT

The present invention is a processing method for applying predetermined processing to a workpiece with said workpiece mounted on a mounting stage arranged in a process chamber in a depressurized atmosphere, in which when no workpiece is mounted on the mounting stage, an inactive gas is discharged from at least a heat transfer gas supply hole of the mounting stage in the process chamber so that a gas layer is formed on a mounting surface of the mounting stage. The present invention is also a processing apparatus.

10 Claims, 5 Drawing Sheets

U.S. PATENT DOCUMENTS

| | | | |
|---|---|---|---|
| 6,373,681 | B2 | 4/2002 | Kanno et al. |
| 6,466,426 | B1 * | 10/2002 | Mok et al. ................... 361/234 |
| 6,506,686 | B2 | 1/2003 | Masuda et al. |
| 6,528,427 | B2 * | 3/2003 | Chebi et al. .................. 438/694 |
| 6,723,202 | B2 | 4/2004 | Nagaiwa et al. |
| 6,759,336 | B1 * | 7/2004 | Chebi et al. .................. 438/694 |
| 6,844,273 | B2 * | 1/2005 | Kato et al. ................... 438/791 |
| 2001/0008172 | A1 | 7/2001 | Shoda et al. |
| 2001/0022293 | A1 | 9/2001 | Maeda et al. |
| 2002/0029745 | A1 | 3/2002 | Nagaiwa et al. |
| 2002/0139388 | A1 * | 10/2002 | Chebi et al. .................. 134/1.3 |
| 2003/0106647 | A1 | 6/2003 | Koshiishi et al. |
| 2003/0164226 | A1 | 9/2003 | Kanno et al. |
| 2004/0005726 | A1 | 1/2004 | Huang |
| 2004/0081439 | A1 * | 4/2004 | Kholodenko et al. ........ 392/416 |
| 2004/0261946 | A1 | 12/2004 | Endoh et al. |
| 2005/0139578 | A1 * | 6/2005 | Fukuda et al. ................ 216/67 |
| 2009/0142513 | A1 * | 6/2009 | Murakami et al. ........... 427/576 |

FOREIGN PATENT DOCUMENTS

| | | | |
|---|---|---|---|
| JP | H7-135200 | | 5/1995 |
| JP | 07-211681 | * | 8/1995 |
| JP | 07-321184 | * | 12/1995 |
| JP | H8-102461 | | 4/1996 |
| JP | 09-082781 | | 3/1997 |
| JP | 09-232290 | * | 9/1997 |
| JP | 11-330047 | | 11/1999 |
| JP | 2001-230239 | | 8/2001 |
| JP | 2002-009048 | | 1/2002 |
| JP | 2002-16126 | | 1/2002 |
| KR | 2001-0098814 | | 11/2001 |

OTHER PUBLICATIONS

Translation of JP 07-321184 to H. Nishikawa, published Dec. 8, 1995.*

07-321184, Dec. 8, 1995, Japan (English Abstract only).

07-074231, Mar. 17, 1995, Japan (English Abstract only).

07-211681, Aug. 11, 1995, Japan (English Abstract only).

09-082781, Mar. 28, 1997, Japan (English Abstract only).

09-232290, Sep. 5, 1997, Japan (English Abstract only).

* cited by examiner

METHOD AND APPARATUS FOR PROCESSING WORKPIECE

This application is a continuation of PCT/JP02/01279 filed on Feb. 15, 2002.

TECHNICAL FIELD

The present invention relates to a processing method for applying film formation and etching to a workpiece such as a semiconductor wafer, and a processing apparatus therefor.

BACKGROUND ART

For example, as described in Japanese Patent Laid-Open Application No. Hei 7-321184, a processing apparatus is known which forms a new film on the surface of a workpiece or etches previously-laminated films in the fabrication process of a semiconductor device.

This processing apparatus incorporates a process chamber that is made of aluminum or the like. This process chamber is equipped inside with a mounting stage for a workpiece to be mounted on, also serving as a bottom electrode, and a top electrode opposed thereto. In the foregoing processing apparatus, the process chamber is evacuated for depressurization before a workpiece mounted on the mounting stage is controlled to a predetermined temperature while a process gas is blown to its surface to be processed. In this state, high frequencies of, e.g., 60 MHz and 13.56 MHz are respectively applied to the top electrode and the bottom electrode (mounting stage) to produce plasma of the process gas, whereby predetermined etching is applied to the workpiece.

This mounting stage is provided with a cooling jacket, and the workpiece mounted can be cooled down to a desired temperature such as −100° C. Moreover, a plurality of heat transfer gas supply holes are made in the mounting surface of the mounting stage. Then, with the workpiece mounted, a heat transfer gas such as helium (He) that is cooled to a desired temperature is supplied through these heat transfer gas supply holes to improve the efficiency of heat transfer to the workpiece.

Moreover, as disclosed in Japanese Patent Laid-Open Application No. Hei 7-74231, the mounting stage is provided with a plurality of lifter pins which move in vertical directions. When a workpiece is carried in/out, those lifter pins move vertically to facilitate passing the workpiece between the mounting stage and the transportation mechanism. These lifter pins are integrally attached to a single base plate. This base plate moves up and down by being driven by an air cylinder for vertical driving which is attached to the outside of the process chamber through an introduction mechanism.

The aforementioned process chamber, however, incorporates a number of components including metal or non-mental parts such as a focus ring for concentrating plasma, aside from the top and bottom electrodes. Since they gradually wear out at portions exposed to inside the process chamber because of the plasma, these components must be replaced after a lapse of a certain period. Nevertheless, in terms of productivity, their replacement needs to be minimized in frequency for the sake of reducing the period of time and the number of times required for maintenance.

As measures for this, attempts have been made to fabricate the focus ring and other components from materials less prone to wear, such as heavy metal oxides including yttria ($Y_2O_3$) and zirconia (ZrO). The fabrication method thereof may involve sintering powder into bulk parts and applying yttria ($Y_2O_3$) coating to aluminum-based components. Moreover, the inner surfaces of the process chamber are also given coating to provide portions for suppressing wear resulting from the plasma.

Nevertheless, even if the components are made of heavy metal oxide, the plasma exposure causes slight wear, and fine particles of the heavy metal are often seen suspending in the process chamber.

Besides, other vapors resulting from the plasma suspend around the heavy metal particles. When these vapors are cooled, there occurs the phenomenon that they condense and simultaneously capture heavy metal particles in their proximity, adhering to cooled portions. Since the mounting stage for a workpiece to be mounted on is cooled by the cooling jacket to a low temperature as described above, fine particles containing the heavy metal are deposited on the exposed mounting surface of the mounting stage when no workpiece is mounted thereon.

Then, if a new workpiece is mounted on the mounting stage, the deposited fine particles containing the heavy metal adhere to the underside of the workpiece, giving rise to the problem that the contaminated workpiece is brought out to the subsequent steps.

DISCLOSURE OF THE INVENTION

It is an object of the present invention to provide a processing method and a processing apparatus which, when no workpiece is mounted on a mounting stage arranged inside the process chamber, can prevent fine particles containing heavy metal from adhering to the mounting surface, thereby avoiding workpiece contamination.

To achieve the foregoing object, the present invention provides a processing method for applying predetermined processing to a workpiece with the workpiece mounted on a mounting stage arranged in a process chamber in a depressurized atmosphere, wherein when no workpiece is mounted on the mounting stage, an inactive gas is discharged to above the mounting stage so that a gas layer comprising the inactive gas is formed over the mounting stage including a mounting surface.

The present invention also provides a processing method for applying processing to a plurality of workpieces by repeating the steps of: carrying a workpiece into a process chamber capable of being maintained in a depressurized atmosphere; mounting the workpiece on a mounting stage arranged in the process chamber; applying predetermined processing thereto; and then carrying the workpiece out of the process chamber, wherein an inactive gas substantially free of heavy metal particles is supplied to near a surface of the mounting stage at a first flow rate in a period between when the workpiece is carried out of the process chamber and when a next workpiece is carried into the chamber, no workpiece lying in the process chamber during the period.

Furthermore, a processing apparatus for applying predetermined processing to a workpiece by introducing a process gas into a process chamber in a depressurized atmosphere is provided, comprising: a mounting stage for the workpiece to be mounted on, arranged in the process chamber; and a first gas supply hole for supplying an inactive gas to a mounting surface of the mounting stage, and wherein a gas layer of the inactive gas is formed on the mounting surface of the mounting stage when the workpiece is not mounted on the mounting stage.

According to the present invention, when the mounting stage (mounting surface) is exposed with no workpiece mounted thereon in between fabrication steps for processing workpieces consecutively, an inactive gas layer comprising, e.g., $N_2$ gas or the like is formed so as to cover the exposed portion of the mounting stage, whereby heavy metal particles can be prevented from adhering to the mounting surface of the mounting stage. This prevents the underside of a new workpiece next to be processed from being contaminated by heavy metal particles when the workpiece is mounted on the mounting stage, avoiding adverse effects on subsequent fabrication steps.

BEST MODE FOR CARRYING OUT THE INVENTION

Hereinafter, embodiments of the present invention will be described in detail with reference to the drawings.

Figure 1:
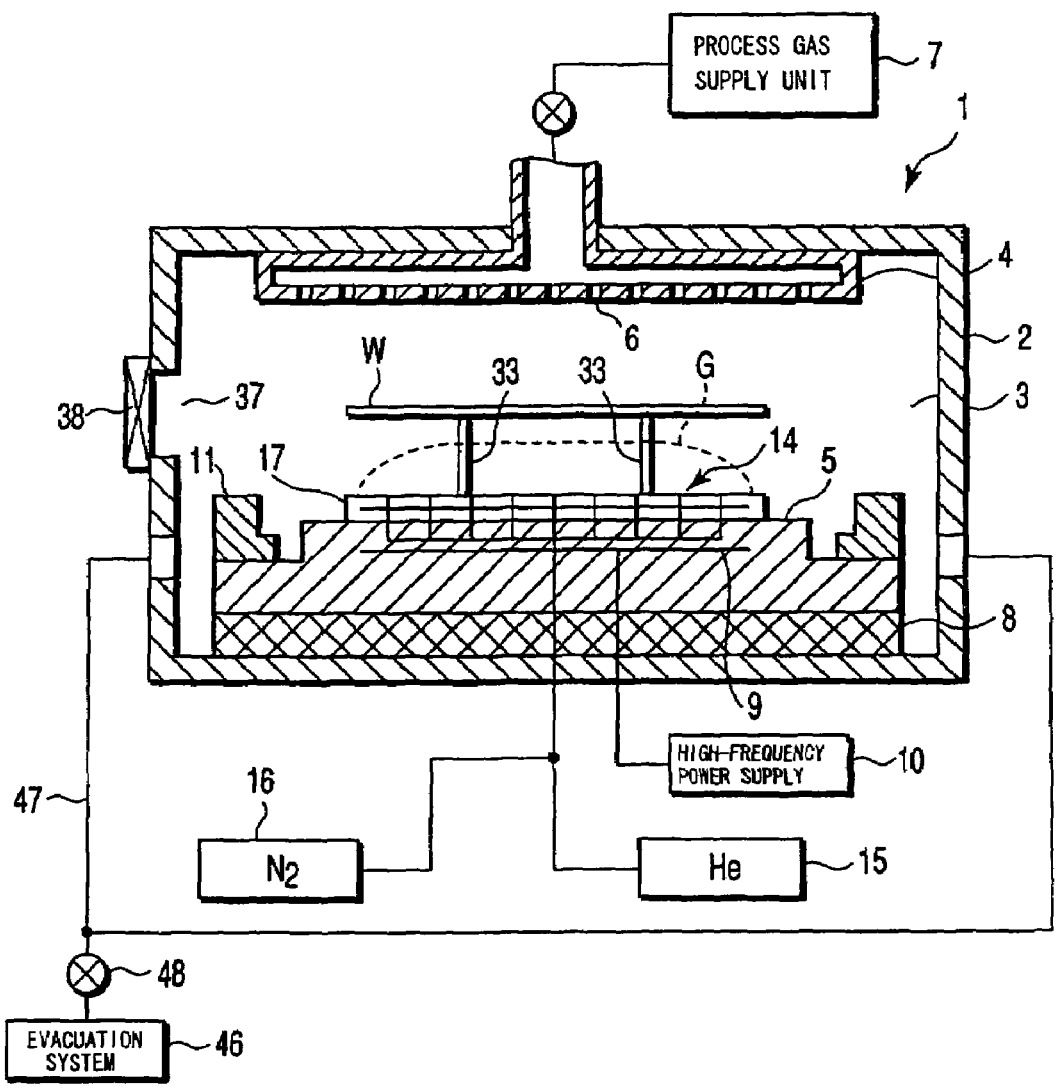
FIG. 1 is a diagram showing the schematic configuration of a processing apparatus according to a first embodiment of the present invention.
Figure 2:
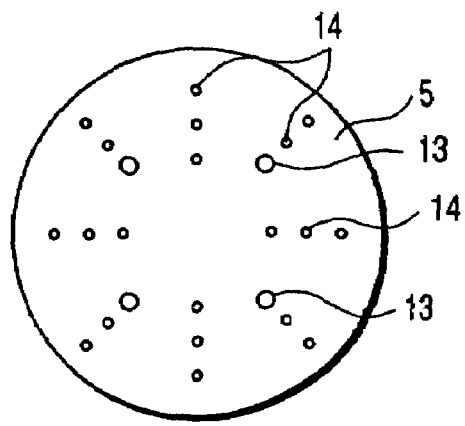
FIG. 2 is a diagram showing the planar configuration of a mounting stage according to the first embodiment.
Figure 3:
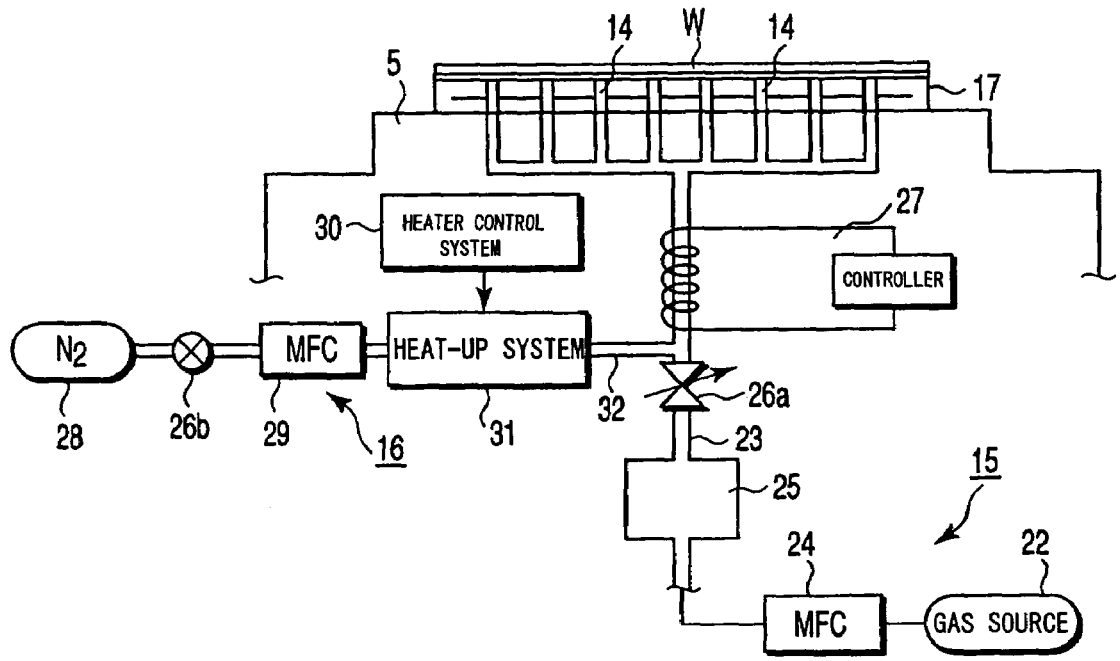
FIG. 3 is a diagram showing the general configuration of a heat transfer gas supply unit and an inactive gas supply unit according to the first embodiment.
Figure 4:
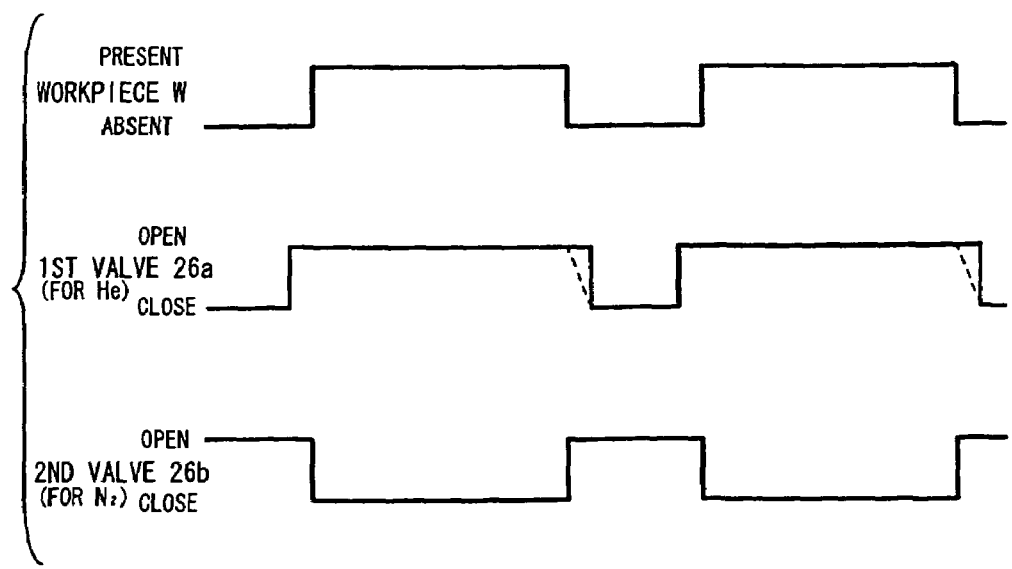
FIG. 4 is a timing chart for explaining the opening and closing of valves according to the first embodiment.

FIG. 1 shows the schematic general configuration of a processing apparatus for applying plasma etching to a workpiece such as a semiconductor wafer according to a first embodiment. FIG. 2 shows the plane configuration of a mounting stage in the process chamber. Moreover, FIG. 3 shows the schematic configuration of a heat transfer gas supply unit and an inactive gas supply unit. FIG. 4 shows a timing chart for explaining the opening and closing of valves on the formation of an inactive gas layer.

A processing apparatus body 1 of the present embodiment is made of a conductive material such as aluminum, and incorporates a box-like process chamber 2 having such an airtightness as can maintain a vacuum state. The inner wall surfaces of this process chamber 2 to be exposed to plasma are given yttria ($Y_2O_3$) coating.

A top electrode 4 is arranged on the top surface inside the process chamber 2. A mounting stage 5 for a workpiece W such as a semiconductor wafer to be mounted on, also serving as a bottom electrode, is arranged on the bottom facing the top electrode 4. The top electrode 4 is connected to a process gas supply unit 7 through gas piping, and has a plurality of process gas supply holes 6 for discharging gas into the process chamber. The surface of the mounting stage 5 to be exposed to inside the process chamber is made of, for example, alumite-treated aluminum of convex disk shape. The workpiece W is mounted on the mounting surface thereof. Besides, the mounting stage 5 is fixed to the bottom of the process chamber 2 via an insulator 8 for electrical isolation. A electrode plate 9 is provided inside the mounting stage 5. This electrode plate 9 is connected to a high-frequency power supply 10 which is installed in the apparatus body 1, and applies a high-frequency voltage to the mounting stage 5 to cause plasma between the electrodes. The space between the top electrode 4 and the mounting stage 5 in this process chamber 2 is a processing space 3 for a workpiece.

In addition, an annular focus ring 11 is arranged around the mounting stage 5. This focus ring 11 is used to concentrate reactive ions onto the workpiece W, and is made of a heavy metal oxide such as yttria ($Y_2O_3$). Furthermore, evacuation holes 12 for evacuating the chamber are provided in side walls of the process chamber 2, below the mounting surface. An evacuation system 46 is connected to the evacuation holes 12 through evacuation pipes 47 and a valve 48. Moreover, a side wall of the process chamber 2 has a gate opening 37 for carrying in/out the workpiece W, which is opened/closed by a gate valve 38.

As shown in FIG. 2, the mounting stage 5 is provided with a plurality of through holes 13 for lifter pins and a plurality of heat transfer gas supply holes 14 for supplying a heat transfer gas. These heat transfer gas supply holes 14 are connected to a heat transfer gas supply unit 15 and an inactive gas supply unit 16 to be described later. In the present embodiment, an electrostatic chuck 17 is employed as a chucking part for holding the workpiece W on the mounting stage 5. The electrostatic chuck 17 is arranged on the mounting surface. Needless to add, a mechanical chuck for holding the workpiece W by means of jaws or the like may be used.

The process gas supply unit 7 in connection with the aforementioned top electrode 4 supplies the top electrode 4 with, for example, $C_{12}$ gas, $C_4F_6$ gas, and $BCl_3$ gas under respective flow rate controls according to the intended processing, by using not-shown flow rate controllers (Mass Flow Controllers: MFCs), valves, and so on.

Next, description will be given of the heat transfer gas supply unit 15 and the inactive gas supply unit 16 in connection with the mounting stage 5.

As shown in FIG. 3, the heat transfer gas supply unit 15 is a gas supply line for supplying the heat transfer gas such as helium gas (He) which is controlled in flow rate and temperature. Arranged on this gas line from the upstream (gas source) side are a heat transfer gas supply source 22 for supplying the heat transfer gas, a flow rate controller (MFC) 24 for controlling the gas flow rate, a buffer tank 25 for stocking the gas temporarily, a first valve 26a for interrupting the supply, and a temperature adjustment unit 27. These are connected to each other with a heat transfer gas supply pipe 23. This temperature adjustment unit 27 is composed of a temperature adjusting part and a controller for cooling the heat transfer gas down to a desired temperature, and controls the heat transfer gas to a predetermined temperature and supplies the same to the heat transfer gas supply holes 14. The heat transfer gas is supplied to the small space between the underside of the workpiece W and the electrostatic chuck 17, thereby enhancing the effect of heat transfer between the mounting stage 5 and the workpiece W.

Now, the inactive gas supply unit 16 is a gas supply line for supplying an inactive gas such as nitrogen gas ($N_2$) which is controlled in flow rate and temperature. Arranged on this gas line from the upstream (gas source) side are an $N_2$ gas supply source 28 for supplying the $N_2$ gas, a second valve 26b for interrupting the supply, an MFC 29 for controlling the flow rate of the gas, and a heat-up system 31, which are connected to each other with a gas introduction pipe 32. This heat-up system 31 is connected to between the heat transfer gas supply pipe 23 and the valve 26a by the gas introduction pipe 32. Then, the heat-up system 31 heats up the $N_2$ gas under the control of a heater control system 30, and supplies the same to the transfer gas supply holes 14 through the heat transfer gas supply pipe 23. Incidentally, the $N_2$ gas is heated to 50° C. to 250° C. by the heat-up system 31, or preferably around 100° C., and blown out of the mounting stage 5 to the process chamber 2 as a hot gas.

Moreover, the mounting stage 5 is provided with four holes 13, for example. Each hole movably accommodates a single lifter pin 33. These lifter pins 33 are fixed to a single lifter pin supporting mechanism (not shown) capable of up and down movement for protrusion from the mounting surface. Needless to add, the number of lifter pins 33 is not limited to four, but may be changed according to design. When a workpiece W is carried in/out, the workpiece W is lifted over the mounting stage 5 by the four lifter pins 33, and in which state it is passed to/from the transportation arm of a not-shown transportation mechanism.

Next, description will be given of the processing sequence for an example where a plasma etching apparatus is applied to the processing apparatus of the first embodiment.

Initially, in carrying a workpiece W into the process chamber 2, the gate opening 37 is opened, and the transportation arm holding the workpiece W is inserted into the process chamber 2 from exterior (transportation chamber or the like) and stopped over the mounting stage 5. Then, the lifter pins 33 are protruded from the holes 13 to above the mounting surface, thereby lifting and receiving the workpiece W from the transportation arm.

After the transportation arm is retracted, the lifter pins 33 are smoothly lowered to mount the workpiece W on the mounting surface, and the workpiece W is held on the mounting surface by the electrostatic chuck 17. At the same time, the gate opening 37 is closed.

After this holding, the heat transfer gas such as helium gas (He) is let out from the heat transfer gas supply source 22 under flow rate control of the flow rate controller 24, and passed through the buffer tank 25 and the first valve 26a to the temperature adjustment unit 27. The heat transfer gas is controlled to a predetermined temperature (temperature for cooling) in the temperature adjustment unit 27, and discharged from the heat transfer gas supply holes 14. Consequently, the heat transfer gas is supplied to the small space between the underside of the workpiece W and the electrostatic chuck 17, thereby enhancing the effect of heat transfer between the stage 5 and the workpiece W.

Next, the evacuation system is driven to evacuate the gas from the process chamber 2 through the evacuation holes 12. In addition, predetermined process gases such as $CF_4$ and $O_2$ of 300 SCCM and 85 SCCM, respectively, are supplied from the process gas supply unit to the processing space 3. Then, the interior of the process chamber 2 is maintained to a predetermined pressure on the order of, e.g., 350 mtorr (46.55 Pa).

Next, the high-frequency power supply 10 applies a high-frequency voltage to the mounting stage 5 to cause plasma in the processing space 3 between the top electrode 4 and the mounting stage 5, thereby applying plasma etching to the workpiece W. After the completion of the plasma etching, the process chamber 2 is evacuated of the residual gas and the like within a predetermined time by means of the evacuation system. Here, the He gas used as the heat transfer gas is also fully evacuated. Subsequently, the interior of the process chamber is adjusted in pressure so that the gate opening can be opened.

Then, the lifter pins 33 are raised to lift the workpiece W off from the mounting stage 5. The gate opening 37 is opened, and the workpiece W is passed to the transportation arm inserted. The transportation arm carries the workpiece W out of the process chamber 2, and carries a new workpiece W next to be processed into the process chamber 2. This new workpiece W is held on the mounting stage 5 as in the previous case.

As in the timing chart shown in FIG. 4, when no workpiece W is mounted on the mounting stage 5, the first valve 26a is closed to stop supplying the heat transfer gas. Meanwhile, the second valve 26b is opened so that $N_2$ gas of, e.g., 10 SCCM or so in flow rate, supplied from the $N_2$ gas supply source 28 is discharged into the process chamber 2. Here, the $N_2$ gas is heated to 50° C. to 250° C. by the heat-up system 31, or preferably around 100° C., and discharged as a hot gas to above the mounting surface. Here, as shown in FIG. 1, an inactive gas layer G of the heated $N_2$ gas is formed to cover over the mounting stage 5 (mounting surface) as shown in FIG. 1.

This inactive gas layer G of $N_2$ gas is kept since a processed workpiece W leaves from the mounting surface until immediately before a new workpiece W next to be processed is held on the mounting surface. In particular, an air pressure difference between the top side and bottom side of a workpiece W is desirably made smaller than or equal to 100 mtorr (13.3 pa) so that the workpiece W will not cause misalignment on the mounting surface at the time of leaving and mounting.

Moreover, as for the relationship between the heat transfer gas and the inactive gas layer G, as shown in FIG. 4, the first valve 26a is opened to supply the He gas from the heat transfer gas supply holes 14 to the underside of a workpiece W immediately before the workpiece W is carried into the process chamber 2 and mounted on the mounting surface by the lifter pins 33. Here, the second valve 26b is closed to stop supplying the $N_2$ gas.

Then, when the processing on the workpiece W is completed, the workpiece W is lifted again by the lifter pins 33 and the second valve 26b is opened to start supplying the $N_2$ gas. At the same time, the first valve 26a is closed to stop supplying the He gas. Incidentally, the first valve 26a may be closed gradually as shown by the broken lines. The amount of the He gas to be supplied can also be reduced gradually by interrupting the supply of the He gas to the buffer tank 25 by using the MFC 24, and fixing the valve 26a to a partly-closed position so that the He gas is supplied to the heat transfer gas supply holes 14 by its residual pressure in the buffer tank 25.

As mentioned previously, the problem to be solved by the present invention lies in the phenomenon that heavy metal particles occurring from plasma-based wear are suspending in the process chamber and adhere to cooled portions.

To solve this, in the first embodiment described above, the inactive gas layer G of the heated $N_2$ gas is formed to cover over the exposed mounting stage 5 (mounting surface). It is therefore possible to prevent heavy metal particles from adhering to the mounting surface of the mounting stage 5. Consequently, when a new workpiece W next to be processed is mounted on the mounting stage 5, heavy metal particles will not adhere to the underside of the workpiece W. This can preclude contamination of the workpiece W and avoid adverse effects on the subsequent fabrication steps. In addition, since the $N_2$ gas is blown out of the heat transfer gas supply holes 14 in the mounting stage 5, heavy metal particles can be prevented from entering the heat transfer gas supply holes 14 and adhering to the inner walls thereof.

Now, description will be given of a second embodiment.

Figure 5:
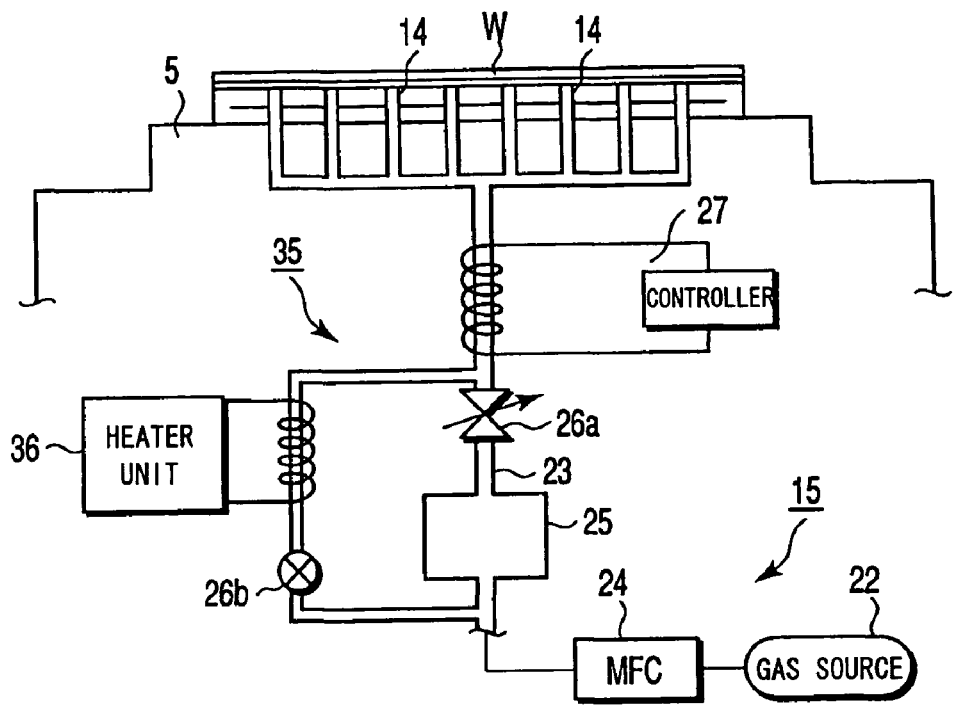
FIG. 5 is a diagram showing the general configuration of a heat transfer gas supply unit and an inactive gas supply unit according to a second embodiment of the present invention.
Figure 6:
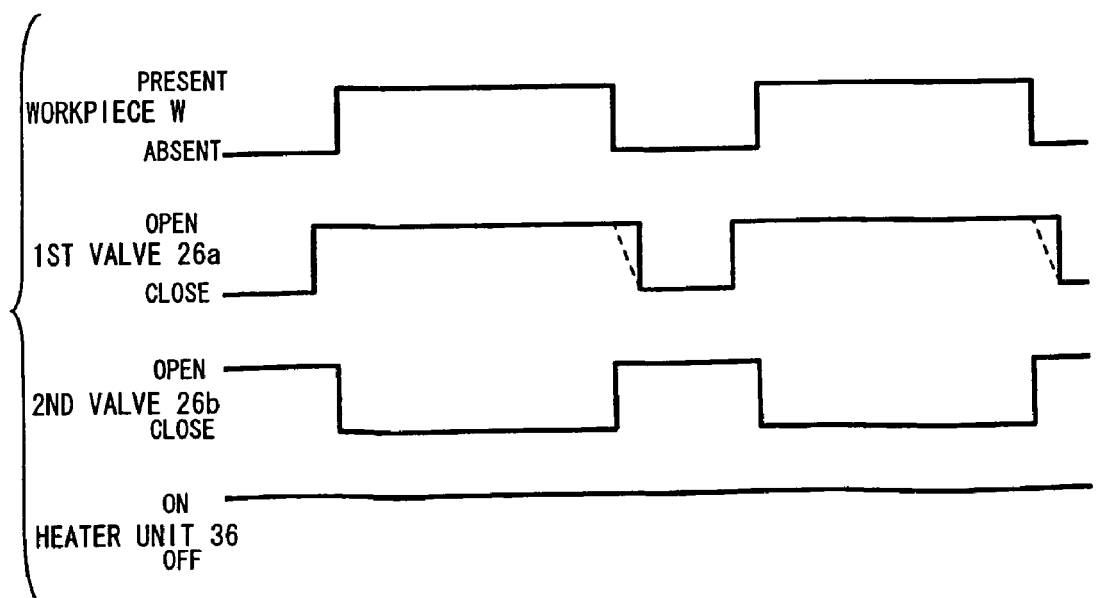
FIG. 6 is a timing chart for explaining the opening and closing of valves according to the second embodiment.

FIG. 5 shows the schematic configuration of a heat transfer gas supply unit and an inactive gas supply unit of the second embodiment. FIG. 6 shows a timing chart for explaining the opening and closing of valves on the formation of an inactive gas layer. Components of this second embodiment identical to the components of the foregoing first embodiment will be designated by the same reference numerals. Description thereof will be omitted.

The present embodiment has a single gas supply source as well as a gas supply channel which consists of two lines, or a main line for supplying a cooled heat transfer gas into the process chamber and a bypass line for supplying a heated heat transfer gas (corresponding to the inactive gas of the first embodiment) into the process chamber.

In this embodiment, a heat transfer gas supply source 22 of He or the like, a flow rate controller (MFC) 24, a buffer tank 25, a first valve 26a, and a temperature adjustment unit 27 are arranged from the upstream (gas source) side as the main line for supplying a heat transfer gas. They are connected to each other by a heat transfer gas supply pipe 23.

In addition, a bypass line 35 is laid from between the MFC 24 and the buffer tank 25 to between the first valve 26a and the temperature adjustment unit 27. A second valve 26b and a heater unit 36 are arranged on this bypass line 35.

According to such configuration, the heat transfer gas is supplied to the heat transfer gas supply holes 14 through the main line when the first valve 26a is opened and the second valve 26b is closed. On the other hand, it is supplied to the heat transfer gas supply holes 14 through the bypass line 35 when the first valve 26a is closed and the second valve 26b is opened.

As shown in the timing chart of FIG. 6, when no workpiece W is mounted on the mounting stage 5, the first valve 26a is closed and the second valve 26b is opened. Due to the opening and closing thereof, He gas from the He gas supply source 22 is heated through the bypass line 35 and discharged from the heat transfer gas supply holes 14 of the mounting stage 5 into the process chamber 2. Here, the He gas is heated to 50° C. to 250° C. by the heater unit 36, or preferably around 100° C., and discharged from the mounting stage 5 to the process chamber 2 as a hot gas so that a gas layer of the heated He gas is formed over the mounting stage 5. Incidentally, the heater unit 36 is always in a driven state, whereas a lamp heater or the like that is excellent in heating start-up characteristics may be used so that the heater unit 36 is driven at the same time as the second valve 26b is opened.

Consequently, the same effects as those of the foregoing first embodiment are provided so that it is possible to prevent heavy metal particles from adhering to the mounting stage 5 (mounting surface) and, by extension, avoid contamination of the workpiece W.

Moreover, in the present embodiment, the He gas is used for both "the heat transfer gas" and "the inactive gas for avoiding the contamination of the mounting stage." This eliminates the need for the separate provision of the inactive gas supply line including the $N_2$ gas supply source as in the foregoing first embodiment, so that the configuration is simplified with an advantage in terms of apparatus cost.

Now, description will be given of a third embodiment.

Figure 7:
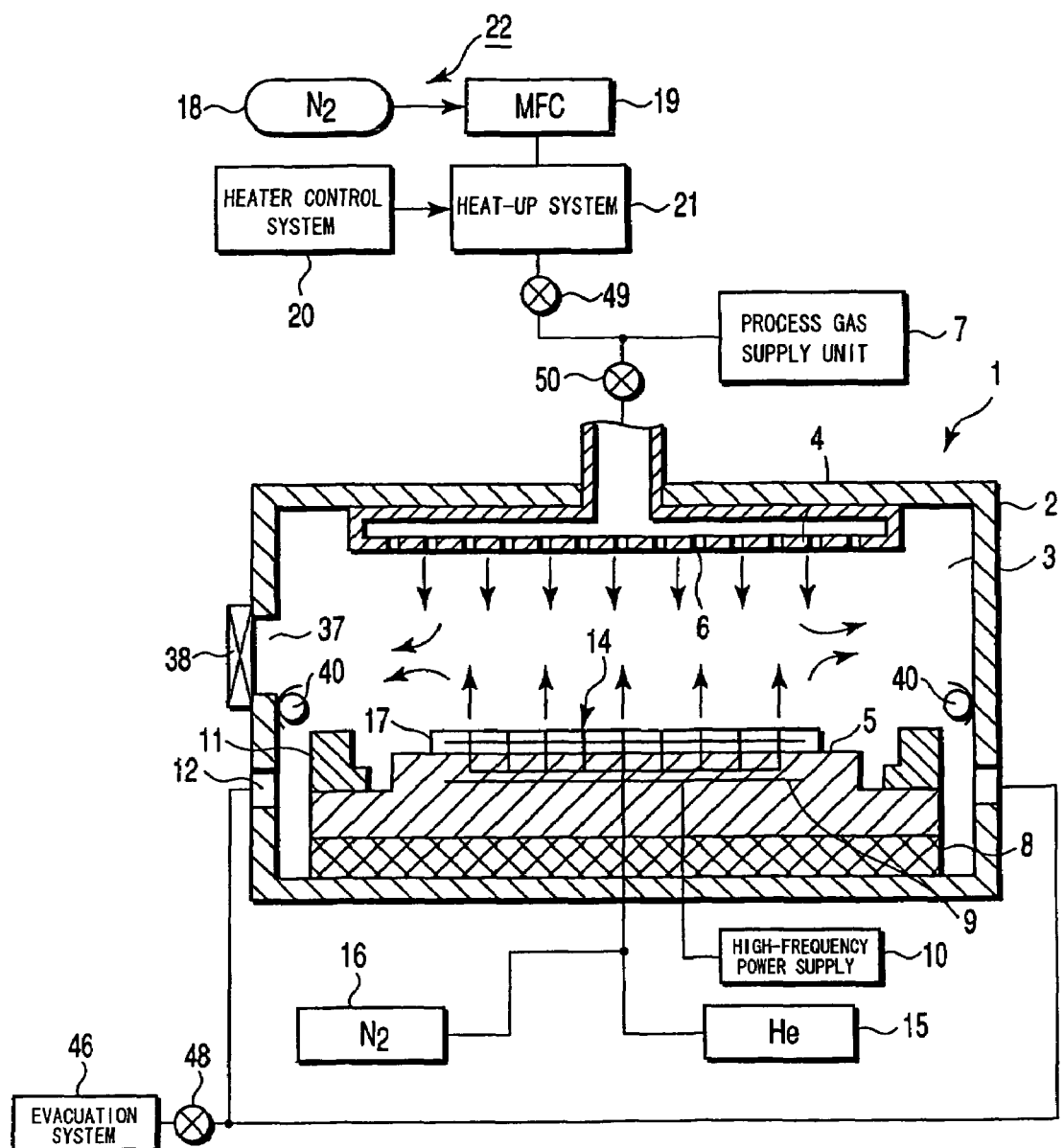
FIG. 7 is a diagram showing the schematic configuration of a processing apparatus according to a third embodiment of the present invention.

FIG. 7 shows the schematic general configuration of a processing apparatus for applying plasma etching to a workpiece such as a semiconductor wafer according to the third embodiment. Components of this third embodiment identical to the components of the foregoing first embodiment will be designated by the same reference numerals. Description thereof will be omitted.

The present embodiment has the configuration that an inactive gas supply unit 22 is arranged not only on the side of the mounting stage (bottom electrode) but also on the side of the top electrode 4 which is opposed to the mounting stage, so that the inactive gas is supplied from both the top electrode 4 and the mounting stage 5 simultaneously.

This inactive gas supply unit 22 is in connection with a process gas supply line consisting of a process gas supply unit 7 and a valve 50, and is connected to the top electrode 4 through the valve 50. This inactive gas supply unit 22 comprises an inactive gas supply unit 22 of $N_2$ or the like, an MFC 19, a heat-up system 21, and a valve 49 from the upstream (gas source) side. The heat-up system 21 is controlled by a heater control system, and heats up $N_2$ gas and supplies the same to the top electrode 4. Incidentally, the $N_2$ gas is heated to 50° C. to 250° C. by the heat-up system 21, or preferably around 100° C., and discharged from the top electrode 4 into the process chamber 2 as a hot gas.

Moreover, the heat transfer gas supply unit 15, the inactive gas supply unit 16, and the evacuation system 46 on the side of the mounting stage 5 are configured the same as in the first embodiment shown in FIGS. 1 and 3.

Next, description will be given of the processing sequence for an example where a plasma etching apparatus is applied to the processing apparatus of this third embodiment.

In this third embodiment, as in the foregoing first embodiment, a workpiece W is carried into the process chamber 2 and mounted on the mounting stage 5 before etching is applied to the workpiece W. After the processing, the process chamber 2 is evacuated of the residual gas and the like inside by means of the evacuation system 46. After the evacuation is completed, the workpiece W is lifted by the lifter pins 33 and passed to a not-shown transportation arm.

When the workpiece W is lifted from inside the processing chamber 2, the first valve 26a is closed, and the second valve 26b and the valves 49 and 50 are opened. By these valve operations, the supply of the He gas is stopped and the heated $N_2$ gas is supplied from the inactive gas supply units 16 and 22 to the mounting stage 5 and the top electrode 4 in the process chamber 2, respectively.

On the side of the mounting stage 5, the $N_2$ gas from the $N_2$ gas supply source 28 is controlled in flow rate and heated up by the MFC 29 and the heat-up system 31, and is discharged into the process chamber 2 through the heat transfer gas supply holes 14, whereby an inactive gas layer of the heat $N_2$ gas is formed over the mounting stage 5. This $N_2$ gas is heated to 50° C. to 250° C. by the heat-up system 31, or preferably around 100° C.

Meanwhile, on the side of the top electrode 4, the $N_2$ gas from the $N_2$ gas supply source 18 is controlled in flow rate and heated up by the MFC 19 and the heat-up system 21, and is discharged into the process chamber 2 through the top electrode 4, whereby an inactive gas layer of the heat $N_2$ gas is formed under the top electrode 4. This $N_2$ gas is heated to 50° C. to 250° C. by the heat-up system 21, or preferably around 100° C., and discharged from the top electrode 4 to the process chamber 2 as a hot gas.

In the configuration as described above, the $N_2$ gases heated to desired temperatures are supplied to the process chamber 2 from above and below the process chamber 2, and collide with each other at a general center of the interior (the processing space 3) to flow around. This results in the state that heavy metal particles suspending inside the process chamber 2 are expelled toward the outer periphery of the process chamber 2. Besides, inactive gas layers are formed of the respective N₂ gases. It is therefore possible to preclude heavy metal particles from adhering to the mounting stage 5 and the top electrode 4.

Consequently, on the mounting surface of the mounting stage 5, heavy metal particles can be prevented from adhesion, and can thus be precluded from adhering to the underside of a new workpiece W next to be processed and contaminating the workpiece W when the workpiece W is mounted on the mounting stage 5. Besides, the top electrode, though smaller in the amount of adhesion of heavy metal particles as compared to the mounting stage 5, becomes still less prone to adhesion.

The supply of both the N₂ gases from the process gas supply holes 6 of the top electrode 4 and the heat transfer gas supply holes 14 of the mounting stage 5 is performed since a workpiece W is carried out of the process chamber 2 until a new workpiece W next to be processed is carried in. The supply of the N₂ gas on the side of the mounting stage 5 is also performed until immediately before the workpiece W is carried in and the lifter pins 33 are lowered to mount the workpiece W on the mounting surface.

Moreover, as shown in FIG. 7, infrared lamps 40 are arranged on the inner walls of the process chamber 2. Here, when no workpiece W is mounted on the mounting stage 5, the infrared lamps 40 may be lit to exercise heat-up of the mounting stage 5 and its periphery along with the supply of the inactive gas. An electric heater may also be embedded in the mounting stage 5.

Figure 8:
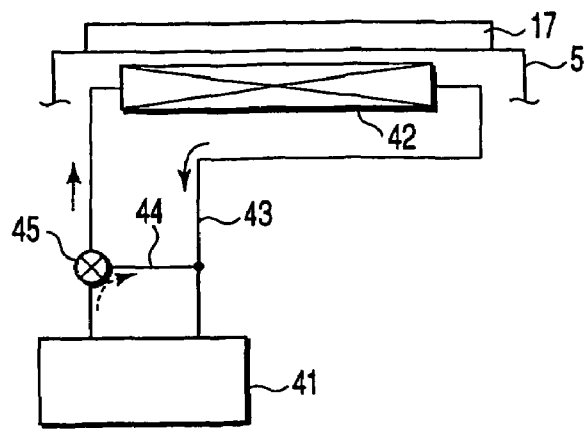
FIG. 8 is a diagram showing the schematic configuration of a modified example according to the present invention.

FIG. 8 shows and describes this modified example of the third embodiment.

Here is shown the configuration as to the mounting stage 5 alone.

In this configuration, a bypass channel 44 and a three-way valve 45 are arranged on a refrigerant circulation line 43 by which a chiller body 41 and a cooler 42 for cooling the mounting stage 5 are connected for refrigerant circulation. When no workpiece W is mounted on this mounting stage 5, the three-way valve 45 may be turned to the bypass channel 44 so that the refrigerant discharged from the chiller body 41 is bypassed to the bypass channel 44 as shown by the broken-lined arrow, for an additional function of increasing the temperature of the mounting stage 5 gradually.

Moreover, when a hot gas is passed through the mounting surface of the mounting stage 5, and particularly when the temperature of the mounting stage 5 is sufficiently low, the operation of the chiller body 41 may be stopped so that the refrigerant will not be discharged from the chiller body 41. Consequently, as compared to the case where the refrigerant is discharged from the chiller body 41 to cool the mounting stage 5 with the cooler 42, the time for raising the temperature of the mounting stage 5 can be made shorter and the gas layer G of heated N₂ gas can be formed faster. This provides the effects of improved throughput and energy saving.

Now, description will be given of a fourth embodiment.

This fourth embodiment is characterized by the timing of supply of the inactive gas. The period where a workpiece W is carried into the process chamber 2, given predetermined processing on the mounting stage 5, and carried out of the vacuum process chamber is finely classified under such patterns as first to fifth cases shown in FIG. 9.

Figure 9:
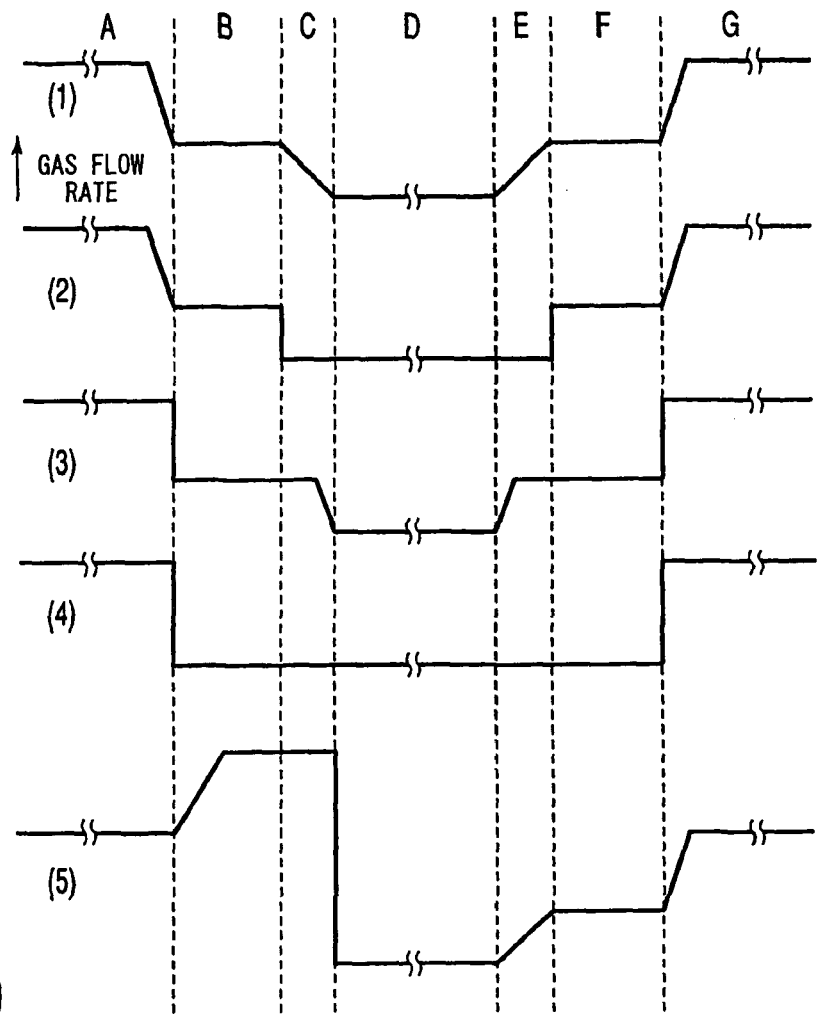
FIG. 9 is a timing chart for explaining gas introduction patterns according to a fourth embodiment of the present invention.

In this FIG. 9, the abscissa represents time or periods A to G. The ordinate represents the gas flow rate of the inactive gas. Of these periods:

Period A is a period where the gate valve of the vacuum process chamber is opened and a workpiece starts being carried into the vacuum process chamber by transportation means such as a transportation arm;

Period B is a period until the workpiece is moved to directly above the mounting stage;

Period C is a period where the workpiece is lowered toward the mounting stage and comes into contact with the mounting stage;

Period D is a period where the workpiece is given predetermined processing while in contact with mounting stage;

Period E is a period where the workpiece is detached from the mounting stage and lifted to directly above the mounting stage;

Period F is a period where the workpiece is carried out of the process chamber by the transportation means, and the gate valve of the vacuum process chamber is closed; and Period G is a period after the gate valve is closed.

In the first case shown in FIG. 9(1), a relatively large amount of an inactive gas is supplied to near the workpiece surface in periods A and G. In periods B and F, a relatively small amount of an inactive gas is supplied. In periods A and G, the relatively high flow rate can be selected for the reason that the absence of a workpiece in the process chamber precludes the possibility that the air flow of the inactive gas might affect workpiece transportation.

In period C, the amount of the inactive gas to be supplied is decreased gradually. Period D involves a gas supply for heat conduction alone. In period E, the amount of the inactive gas to be supplied is increased gradually.

Next, the second case shown in FIG. 9(2) differs from the first case in that not the inactive gas but the heat conduction gas alone is discharged in periods C and E. In periods C and E, the workpiece is lowered or lifted from directly above the mounting stage, and thus a flow of the inactive gas, if any, might cause a displacement of the workpiece. An inflow of air containing heavy metal particles, however, can be avoided to some extent by simply discharging the heat transfer gas since the space over the mounting stage is limited by the workpiece.

The third case shown in FIG. 9(3) differs from the first case in that the flow rate changes instantaneously between periods A and B and between periods F and G, that substantially the same amount of the inactive gas as in period B is supplied in period C until immediately before the end of the period, and that substantially the same amount of the inactive gas as in period F is supplied from immediately after the start of period E.

The fourth case shown in FIG. 9(4) differs from the first case in that the inactive gas is supplied in periods A and G but not in the other periods. In this fourth case, the inactive gas is supplied only in the periods where the workpiece lies outside the process chamber and a processing space appears over the mounting stage with a maximum possibility of heavy metal contamination. In each of the cases described previously, the heat transfer gas such as He gas is supplied from the gas channel in the mounting stage during period D. Moreover, during the periods where the inactive gas flows, the flow rate of the inactive gas shall be higher than the flow rate of the heat transfer gas in period D. The inactive gas to be supplied to near the mounting surface is preferably 50° C. to 250° C. in temperature, and most preferably around 100° C.

The fifth case shown in FIG. 9(5) is intended to uniformize the temperature of the mounting stage and, by extension, achieve temporal uniformization of the temperature of the workpiece.

In this fifth case, until the movement to directly above the mounting stage and the mounting on the mounting stage in periods B and C, the temperature of the mounting stage is once increased by making the gas flow rate of the inactive gas higher than in the no-workpiece state of period A. Then, in period D, the supply of the inactive gas is stopped to switch to the supply of the heat transfer gas alone. Subsequently, in periods E, F, and G, the gas supply is performed as in the first case. Upon the transition from period C to period D, the mounting stage temporarily increased in temperature falls in temperature by being cooled by the heat transfer gas, and then increases in temperature due to heat generation resulting from the application of the high-frequency voltage for producing plasma. The mounting stage thus exhibits V-shaped temperature characteristics.

Since the mounting stage is given such temperature characteristics, the workpiece mounted on the mounting stage can be raised to a predetermined temperature more quickly, and the temperature of the workpiece can be rendered more uniform temporally as compared to heretofore.

Figure 10:
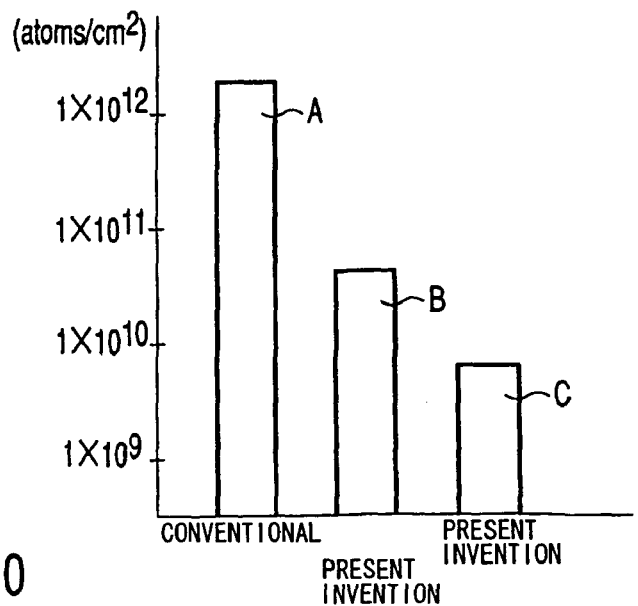
FIG. 10 is a diagram for comparison between the conventional art and the technology according to the present invention.

FIG. 10 shows an experimental example based on the foregoing embodiment. The ordinate represents the amount of heavy metal particles adhering to the mounting stage (the number of yttria ($Y_2O_3$) atoms/cm2). On the abscissa, A represents an example of a conventional mounting stage without gas supply, B an example where the mounting stage according to the present invention is provided with a gas at normal temperatures, and C an example where the mounting stage according to the present invention is supplied with a hot gas heated to approximately 100° C. The amounts of yttrium contamination were measured by total reflection X-ray fluorescence (TXRF) and a vapor phase decomposition inductively coupled plasma method (VPD/ICP-MS).

As shown in FIG. 10, in the conventional art, the amount of heavy metal particles adhering to the mounting stage 5 was $3 \times 10^{12}$. Meanwhile, B was $5 \times 10^{10}$ and C was $6 \times 10^9$, or one-hundredths and one-thousandths. This shows significant reductions in the amount of the adhering heavy metal.

That is, when no workpiece W is mounted on the mounting stage 5, the supply of the inactivate gas such as $N_2$ gas from the heat transfer gas supply holes 14 forms a gas layer (air curtain) on the mounting surface of the mounting stage 5, which prevents heavy metal particles suspending from entering to adhere. Moreover, the inactive gas such as $N_2$ gas is heated into a hot gas so that heavy metal particles about to enter the mounting stage 5 are re-evaporated by the hot gas. This means further prevention of the entry of heavy metal particles.

Incidentally, while the foregoing embodiments each have dealt with a processing apparatus for applying plasma etching to a workpiece, this invention is applicable to any processing apparatus. Besides, the heat transfer gas and the inactive gas are not limited to the foregoing embodiments, but may be changed as appropriate.

As has been described so far, according to this invention, forming a gas layer of an inactive gas over the mounting stage can prevent heavy metal particles from adhering to the mounting surface of the mounting stage and from being transferred to the underside of a next workpiece to contaminate the workpiece when the workpiece is mounted on the mounting stage.

Furthermore, since the inactive gas is heated and blown out as a hot gas, heavy metal particles about to adhere to the mounting stage are re-evaporated with a high effect of avoiding particle adhesion. Besides, since the inactive gas is blown out of the heat transfer gas supply holes of the mounting stage, it is possible to prevent heavy metal particles suspending in the process chamber from adhering to inside the heat transfer gas supply holes.

INDUSTRIAL APPLICABILITY

According to the present invention, the processing method and processing apparatus for applying such processing as film formation and etching to a workpiece can form a gas layer of an inactive gas so as to cover the mounting stage having no workpiece mounted thereon, thereby preventing heavy metal particles from adhering to the mounting surface of the mounting stage and from adhering to the underside of a new workpiece next to be processed to contaminate the workpiece when the workpiece is mounted on the mounting stage. Moreover, since the inactive gas is heated and blown out to above the mounting stage as a hot gas, heavy metal particles about to adhere to the mounting stage can be re-evaporated to avoid particle adhesion. Moreover, heavy metal particles suspending in the process chamber can be prevented from adhering to inside the heat transfer gas supply holes.

The invention claimed is:

1. A plasma processing method comprising the steps of:
 a) carrying a workpiece into a process chamber capable of being maintained in a subatmospheric pressure, and moving said workpiece to a position over a mounting stage arranged in said process chamber;
 b) mounting said workpiece on a surface of said mounting stage;
 c) with said workpiece mounted on the surface of said mounting stage, applying processing to a surface of said workpiece in a plasma atmosphere while supplying a heat transfer gas which has a first temperature to a space between the surface of said mounting stage and said workpiece through a gas channel arranged in said mounting stage;
 d) detaching said workpiece from the surface of said mounting stage to a position above said mounting stage; and
 e) carrying said workpiece from the position above said mounting stage to a position outside said process chamber, wherein
 a heated $N_2$ or He gas which has a second temperature is supplied through the gas channel to the surface of said mounting stage to form a layer of gas with a temperature of from 50° to 250° C. over the mounting stage in periods of the steps a) and e),
 wherein the second temperature is higher than the first temperature, and
 wherein a set of steps from step a) to step e) is repeated for every processing of one workpiece.

2. The plasma processing method according to claim 1, wherein said heated $N_2$ or He gas is supplied to the surface of said mounting stage
 in a period of the step b) until immediately before said workpiece is mounted on the surface of said mounting stage, and
 in a period of the step d) from immediately after said workpiece is detached from the surface of said mounting stage.

3. The plasma processing method according to claim 1, wherein the flow rate of said $N_2$ or He gas in periods of the steps a) and e) is higher than the flow rate of said heat transfer gas in the step c).

4. The plasma processing method according to claim 1, wherein a heated $N_2$ gas is supplied from gas supply means arranged above the surface of said mounting stage.

5. The plasma processing method according to claim 1, wherein said heated $N_2$ gas is supplied through the gas channel and is 50° C. to 250° C. in the steps a) and e).

6. The plasma processing method according to claim 1, wherein in the periods of said steps a) to e),
   said $N_2$ or He gas is substantially free of metal particles and is supplied to the surface of said mounting stage at a flow rate higher than a flow rate of the heat transfer gas in the steps b) to d), during the periods of the steps a) and e) where said workpiece is moved.

7. The plasma processing method according to claim 1, wherein the gas channel extends from a bottom of the mounting stage to a top of the mounting stage where the workpiece is mounted in step b).

8. The plasma processing method according to claim 1, wherein He is supplied to the surface of said mounting stage during all of steps a) through e).

9. The plasma processing method according to claim 8, wherein the He is supplied via passage through a first valve during steps a) and e) and through a second valve connected in parallel fluid communication with the first valve during steps b) through d), and
   wherein the second valve is connected in series fluid communication with a heater that heats the He during steps a) and e).

10. The plasma processing method according to claim 9, wherein the heater is in an on state during steps a) through e).

\* \* \* \* \*